(12) United States Patent
Nagasaki et al.

(10) Patent No.: US 8,610,429 B2
(45) Date of Patent: Dec. 17, 2013

(54) MAGNETIC FIELD SENSOR DEVICE

(75) Inventors: Yasuhiko Nagasaki, Chiba (JP); Toshifumi Matsuoka, Kyoto (JP); Akira Saito, Tokyo (JP); Koichi Okuzumi, Chiba (JP)

(73) Assignees: Japan Oil, Gas and Metals National Corporation (JP); Kyoto University (JP)

( * ) Notice: Subject to any disclaimer, the term of this patent is extended or adjusted under 35 U.S.C. 154(b) by 247 days.

(21) Appl. No.: 12/999,272

(22) PCT Filed: Jun. 8, 2009

(86) PCT No.: PCT/JP2009/060436
§ 371 (c)(1),
(2), (4) Date: Feb. 18, 2011

(87) PCT Pub. No.: WO2009/154095
PCT Pub. Date: Dec. 23, 2009

(65) Prior Publication Data
US 2011/0133733 A1 Jun. 9, 2011

(30) Foreign Application Priority Data
Jun. 16, 2008 (JP) .................................. 2008-157100

(51) Int. Cl.
*G01R 33/02* (2006.01)
*G01R 33/12* (2006.01)
*G01N 27/72* (2006.01)

(52) U.S. Cl.
USPC ............................ 324/244; 324/228; 324/260

(58) Field of Classification Search
USPC ................................................ 324/244, 260
See application file for complete search history.

(56) References Cited

U.S. PATENT DOCUMENTS

| 2003/0094942 A1 | 5/2003 | Friend et al. |
| 2006/0190174 A1* | 8/2006 | Li et al. ........................ 701/224 |
| 2008/0117044 A1 | 5/2008 | Hibbs |

FOREIGN PATENT DOCUMENTS

| JP | 07-181239 A | 7/1995 |
| JP | 11-148968 A | 6/1999 |
| JP | 2000-258517 A | 9/2000 |
| JP | 2002-071828 A | 3/2002 |
| JP | 2003-099886 A | 4/2003 |
| JP | 2003-121517 A | 4/2003 |
| JP | 2004-325353 A | 11/2004 |
| JP | 2005-509889 A | 4/2005 |

OTHER PUBLICATIONS

Partial Translation of JP 2000-258517, Sep. 22, 2000.*
Partial Translation of JP 2003-099886, Apr. 4, 2003.*

(Continued)

*Primary Examiner* — Bot Ledynh
(74) *Attorney, Agent, or Firm* — Harness, Dickey & Pierce, P.L.C.

(57) ABSTRACT

A magnetic field sensor device 1 includes a sensor section 100 that includes a magneto-impedance device 110 having a magnetic amorphous structure, and rod-shaped core sections 130 and 131 that guide a magnetic field to the magnetic amorphous structure in a longitudinal direction with respect to the magnetic amorphous structure. The core sections 130 and 131 may be provided on either side of the magnetic amorphous structure in the longitudinal direction. The core sections 130 and 131 may be disposed so that the longitudinal direction of the magnetic amorphous structure coincides with the longitudinal direction of the core sections 130 and 131. The magnetic field sensor device 1 may include environmental magnetic field cancellation means 140 and 141 that generate a correction magnetic field that cancels the environmental magnetic field input to the magnetic amorphous structure.

16 Claims, 14 Drawing Sheets

(56) References Cited

OTHER PUBLICATIONS

Partial Translation of JP 2004-325353, Nov. 18, 2004.*
Russian Office Action for Application No. 2011101412/28 (001753) mailed Feb. 18, 2013 with English Translation (8 pages).
Japanese Office Action for Application No. 2008-157100 dated Jan. 9, 2013 with English Translation (3 pages).
Mouri, Kaneo, "Magnetic Sensor Technology", Corona Publishing Co., Ltd., Mar. 10, 1998, pp. 92-101.

* cited by examiner

MAGNETIC FIELD SENSOR DEVICE

TECHNICAL FIELD

The present invention relates to a magnetic field sensor device.

BACKGROUND ART

In recent years, it has been discovered that the impedance of a magnetic amorphous material changes due to an external magnetic field, and a magneto-impedance device (MI device) has been developed. For example, JP-A-7-181239 discloses a magneto-impedance device. A magnetic detection device utilizing such a magneto-impedance device has also been developed. For example, JP-A-2003-121517 and "Magnetic Sensor Technology" (Kaneo Mouri, Corona Publishing Co., Ltd., Mar. 10, 1998, pp. 92 to 101) disclose a magnetic detection device utilizing a magneto-impedance device.

An underground electromagnetic exploration method utilizing an electromagnetic induction phenomenon has been widely used for exploration of resources (e.g., mine, geothermal energy, and petroleum) and underground structure investigation. Various electromagnetic exploration methods have been developed. At present, an underground electromagnetic exploration method that artificially generates an electromagnetic field underground to implement underground exploration is used in practice. For example, JP-A-2002-71828 discloses an underground electromagnetic exploration method that determines the ground geological structure.

A time-domain electromagnetic method (TDEM method) is a representative underground electromagnetic exploration method. In the TDEM method, an induced current generating transmitter is disposed on the ground, and an alternating direct current having an ON/OFF time is caused to flow through the induced current generating transmitter. When the current that flows through the induced current generating transmitter is rapidly cut, an induced current flows through the earth's surface so as to prevent a change in magnetic field according to the law of electromagnetic induction.

The induced current diffuses toward deep underground with time. Since the induced current attenuates corresponding to the specific resistivity of the current path, the underground specific resistivity distribution can be determined by measuring the magnetic field formed by the induced current on the earth's surface as a function of time.

SUMMARY OF THE INVENTION

Technical Problem

An induction coil has been generally used as a magnetic field sensor used for underground electromagnetic exploration. However, the induction coil used for underground electromagnetic exploration is large (e.g., length: 1 m or more, weight: 10 kg or more). Therefore, since it is difficult to inexpensively perform measurements at a number of locations in a short period of time due to difficulty in transportation and installation of the induction coil, an improvement in measurement efficiency of underground electromagnetic exploration is hindered.

The invention was conceived in view of the above-described situation. An object of the invention is to provide a magnetic field sensor device suitable for underground electromagnetic exploration.

Solution to Problem (1) A magnetic field sensor device according to the invention comprises:
a sensor section that includes a magneto-impedance device having a magnetic amorphous structure; and
a rod-shaped core section that guides a magnetic field to the magnetic amorphous structure and is disposed in a longitudinal direction with respect to the magnetic amorphous structure.

According to the invention, the sensitivity of the magnetic field sensor device can be improved by providing the rod-shaped core sections in the longitudinal direction (magnetic field measurement direction) of the magnetic amorphous structure having the highest magnetic field sensitivity. Moreover, a magnetic field sensor device that can be reduced in size and weight as compared with an induction coil can be implemented.

(2) In the above magnetic field sensor device,
the core section may be disposed on each side of the magnetic amorphous structure in the longitudinal direction.

A magnetic field can be efficiently guided to the magnetic amorphous structure by disposing the core section on each side of the magnetic amorphous structure in the longitudinal direction.

(3) In the above magnetic field sensor device,
the core section may be disposed so that the longitudinal direction of the magnetic amorphous structure coincides with a longitudinal direction of the core section.

(4) In the above magnetic field sensor device,
the core section may be formed of a high-permeability material.

(5) In the above magnetic field sensor device,
the high-permeability material may be mu-metal.
The high-permeability material may also be ferrite or the like.

(6) The above magnetic field sensor device may further comprise:
environmental magnetic field cancellation means that generates a correction magnetic field that cancels an environmental magnetic field input to the magnetic amorphous structure.

The observation target magnetic field can be efficiently observed by canceling the environmental magnetic field.

(7) In the above magnetic field sensor device,
the environmental magnetic field cancellation means may be a coil that is wound around the core section.

(8) The above magnetic field sensor device may further comprise:
adjustment means that controls the environmental magnetic field cancellation means so that observational data falls within a desired range.

(9) The above magnetic field sensor device may further comprise:
observation means that serially observes a magnetic field including a magnetic field signal based on an output from an induced current generating transmitter;
storage means that stores observational data observed by the observation means; and
correction means that corrects a reference value of the observational data so that the observational data falls within a desired range based on a value obtained by integrating the observational data stored in the storage means for a period in which an integral value of the magnetic field signal based on the output from the induced current generating transmitter is zero.

The correction means may decrease the reference value of the measurement data when a value obtained by integrating the observational data for a period equal to an integral multiple of the output cycle has exceeded the upper limit reference value, and may increase the reference value of the measurement data when a value obtained by integrating the observational data for a period equal to an integral multiple of the output cycle has become lower than the lower limit reference value.

According to this configuration, since the amount of temporal change in observational data due to a temporal change in terrestrial magnetism can be automatically corrected, the magneto-impedance device is not saturated. This enables an automatic measurement.

(10) In the above magnetic field sensor device, the period in which the integral value of the magnetic field signal based on the output from the induced current generating transmitter is zero may be a period equal to an integral multiple of an output cycle of the induced current generating transmitter that outputs an alternating direct current.

When the induced current generating transmitter outputs an alternating direct current (i.e., a signal of which the positive output in the first period of the cycle is symmetrical with the negative output in the second period of the cycle), for example, the period in which the integral value of the magnetic field signal based on the output from the induced current generating transmitter is zero may be a period equal to an integral multiple of the output cycle of the induced current generating transmitter, or may be the combination of a first interval and a third interval or the combination of a second interval and a fourth interval when equally dividing the output cycle into the first to fourth intervals.

(11) The above magnetic field sensor device may further comprise:

amplifier means that amplifies an output signal from the sensor section, and the correction means may control an offset amount of the amplifier means.

(12) The above magnetic field sensor device may further comprise:

synchronization means that acquires time data synchronized with the output from the induced current generating transmitter, and the storage means may store the observational data and the time data while associating the observational data with the time data.

(13) In the above magnetic field sensor device, the synchronization means may acquire the time data synchronized with the output from the induced current generating transmitter by acquiring time information included in GPS information.

(14) The above magnetic field sensor device may further comprise:

stack means that performs a stack process that averages data obtained by summing up the observational data in a first period of an output cycle of the induced current generating transmitter and sign-inversion data of the observational data in a second period of the output cycle corresponding to a plurality of cycles, and the observation means may stop observation based on a noise level of data after the stack process.

DESCRIPTION OF EMBODIMENTS

Embodiments to which the invention is applied are described below with reference to the drawings. Note that the invention is not limited to the following embodiments. The invention encompasses arbitrary combinations of the elements of the following embodiments.

1. Magnetic Field Sensor Device

Figure 1:
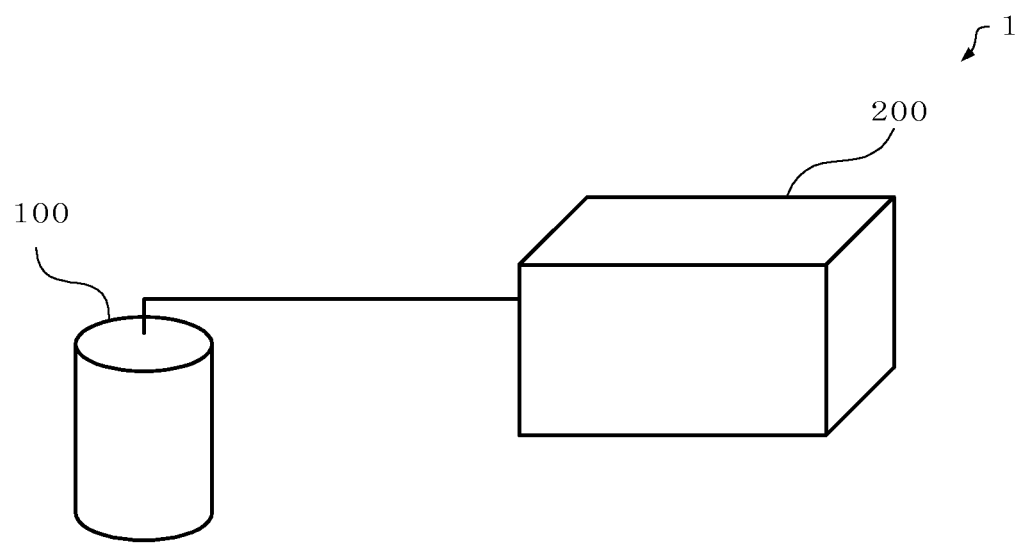
FIG. 1 is a schematic view illustrating the configuration of a magnetic field sensor device according to one embodiment of the invention.

FIG. 1 is a schematic view illustrating the configuration of a magnetic field sensor device according to this embodiment.

A magnetic field sensor device 1 according to this embodiment includes a sensor section 100 and a processing section 200. FIG. 1 illustrates one sensor section 100 and one processing section 200 for convenience of description. Note that the magnetic field sensor device 1 may include a plurality of sensor sections corresponding to one recording section.

The sensor section 100 includes a magneto-impedance device having a magnetic amorphous structure. The sensor section 100 detects a magnetic field, and transmits an output signal based on the magnitude of the detected magnetic field to the processing section 200.

The processing section 200 receives the output signal from the sensor section 100, performs given signal processing on the output signal, and records the output signal as observational data. The processing section 200 also controls the sensor section 100.

Figure 2:
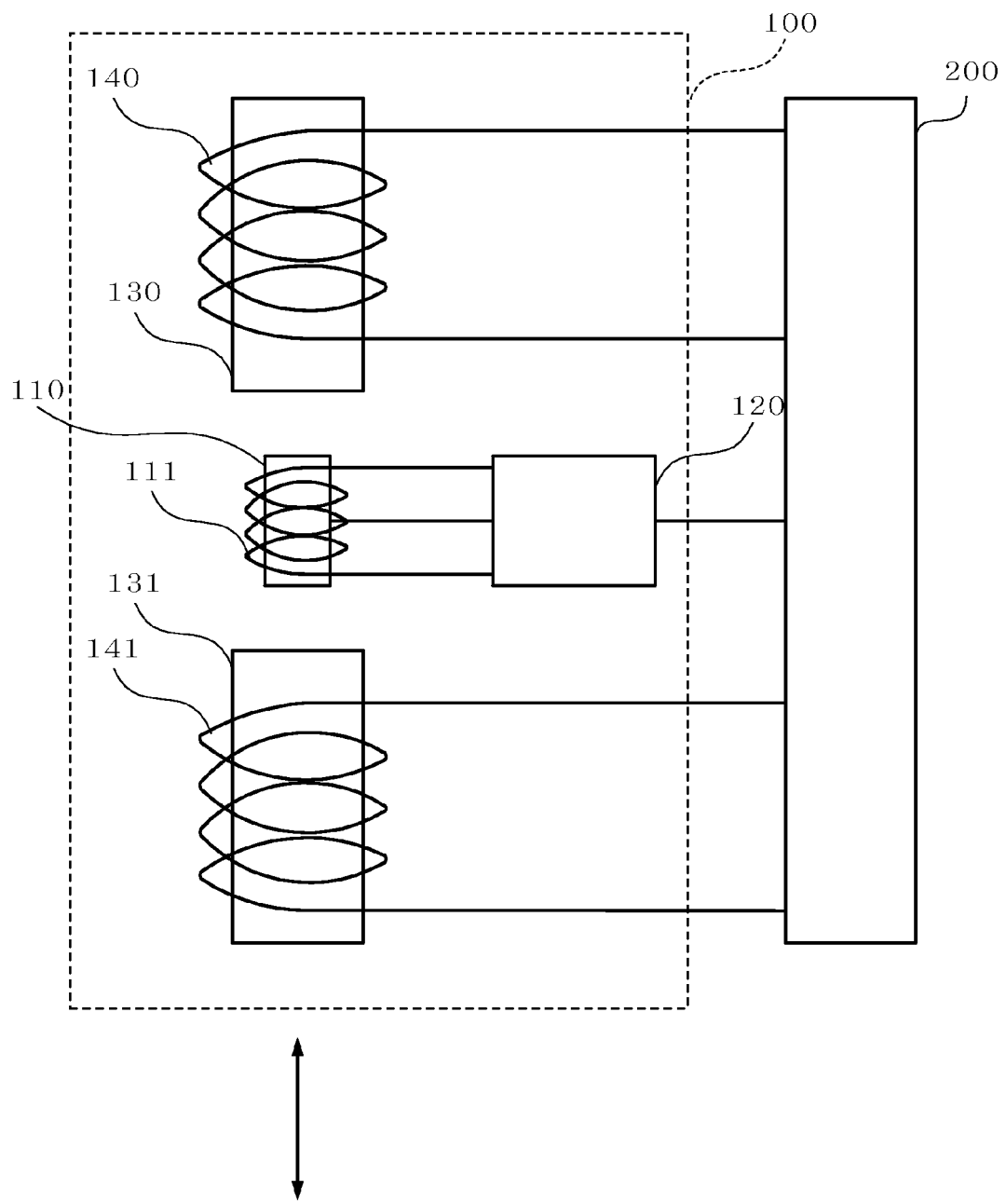
FIG. 2 is a schematic diagram illustrating an example of the configuration of a sensor section.

FIG. 2 is a schematic diagram illustrating an example of the configuration of the sensor section 100.

The sensor section 100 includes a magneto-impedance device 110 having a magnetic amorphous structure. The magneto-impedance device 110 detects a magnetic field in the longitudinal direction. In this embodiment, the magneto-impedance device 110 detects a magnetic field in the vertical direction (arrow direction) in FIG. 2. In this embodiment, the length of the magneto-impedance device 110 in the longitudinal direction is about 4 mm.

The sensor section 100 includes a driver circuit 120. The driver circuit 120 drives the magneto-impedance device 110, and outputs an output signal to the processing section 200.

The sensor section 100 may include a measurement coil 111 that forms the driver circuit 120 and is provided around the magneto-impedance device 110.

Figure 5:
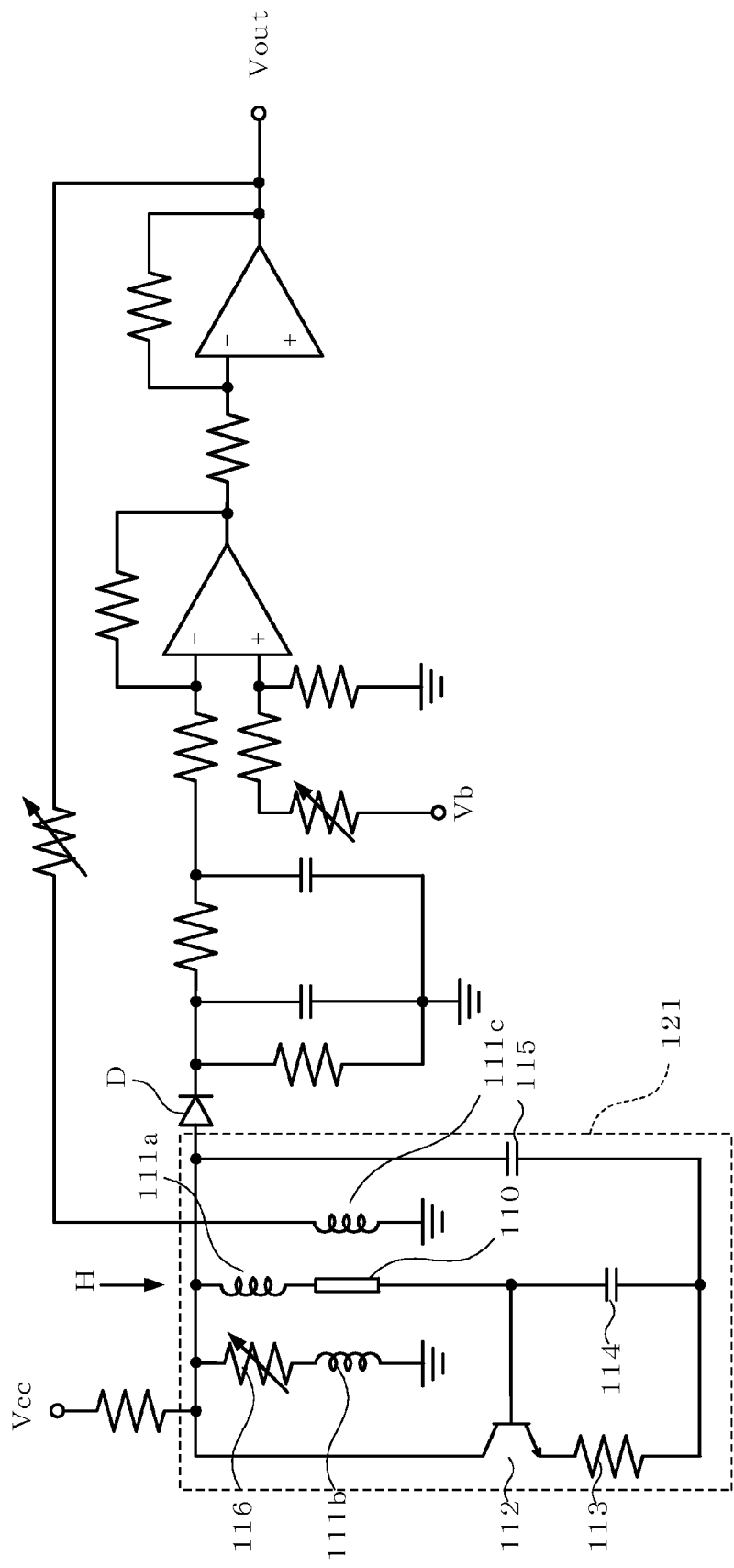
FIG. 5 is a circuit diagram illustrating an example of a driver circuit.

FIG. 5 is a circuit diagram illustrating an example of the driver circuit 120. In the example of FIG. 5, the driver circuit 120 mainly includes a Colpitts oscillation circuit 121 that includes the magneto-impedance device 110. The Colpitts oscillation circuit 121 includes coils 111a, 111b, and 111c (i.e., the measurement coil 111), a transistor 112, a resistor 113, capacitors 114 and 115, and a variable resistor 116.

In the circuit of FIG. 5, the amplitude of the resonance voltage of the Colpitts oscillation circuit 121 is modulated by a magnetic field H. The amplitude-modulated voltage is detected via a Schottky barrier diode D. The differential voltage between the detected voltage and a zero-point-setting DC bias voltage Vb is amplified, and an output voltage Vout is output as an output signal. The output voltage Vout is fed back to the Colpitts oscillation circuit 121. This implements a driver circuit 120 having high linearity and no hysteresis.

The sensor section 100 includes rod-shaped core sections 130 and 131. The core sections 130 and 131 are disposed on either side of the magneto-impedance device 110 having a magnetic amorphous structure in the longitudinal direction. The core sections 130 and 131 guide a magnetic field to the magnetic amorphous structure of the magneto-impedance device 110. The core sections 130 and 131 may be formed of a high-permeability material (e.g., mu-metal or ferrite).

Figure 3:
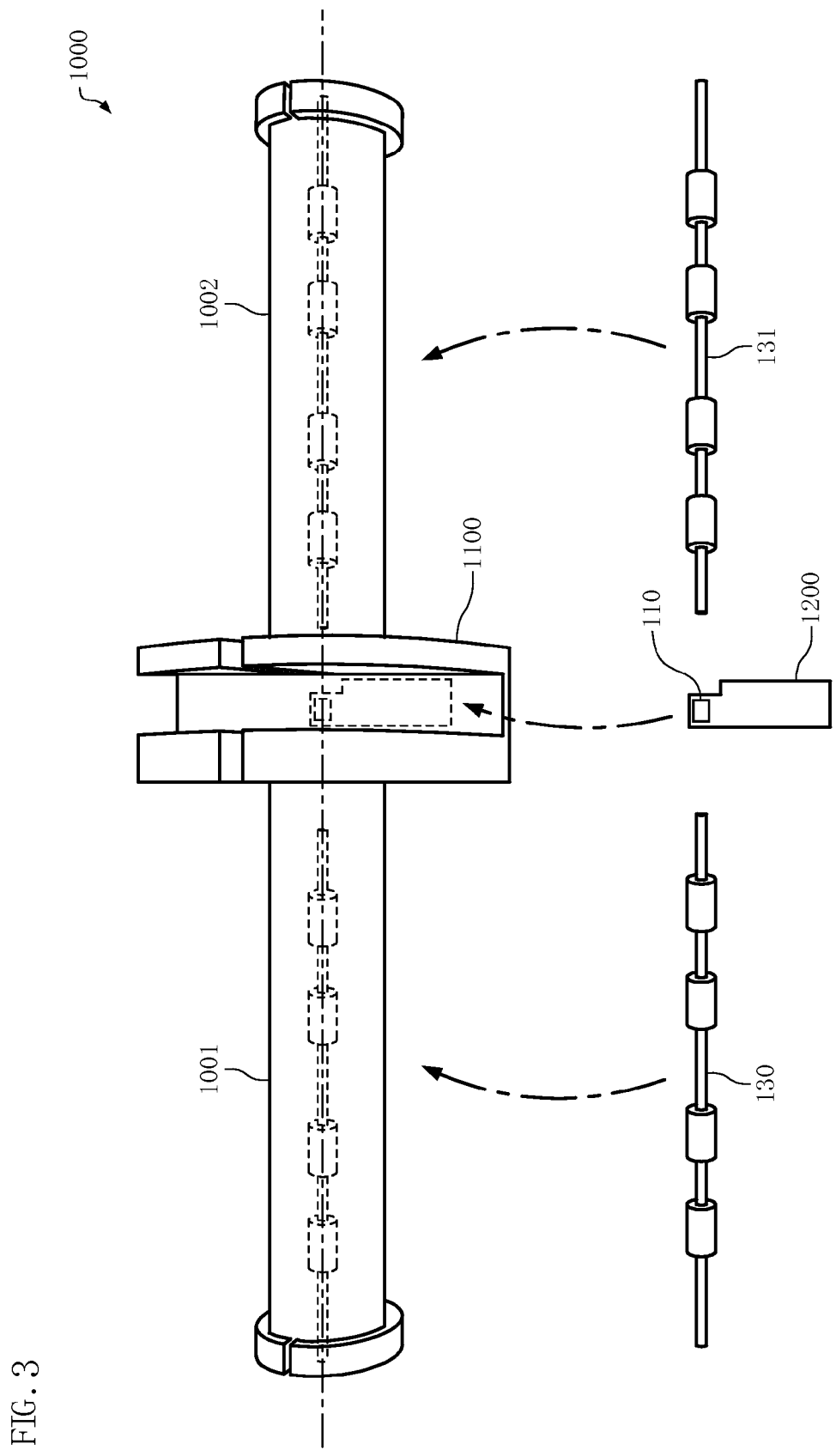
FIG. 3 illustrates an example of the appearance of a sensor section.

FIG. 3 illustrates an example of the appearance of the sensor section 100 of the magnetic field sensor device 1 according to the embodiment. The sensor section 100 includes a casing 1000. The casing 1000 includes cylindrical sections 1001 and 1002 and a sensor support section 1100. The casing 1000 has a total length of 250 mm and a diameter of 76 mm.

A sensor board 1200 that includes the magneto-impedance device 110 having the magnetic amorphous structure and the driver circuit 120 is provided in the support section 1100, and the core sections 130 and 131 are respectively provided in the cylindrical sections 1001 and 1002. The magneto-impedance device 110 and the core sections 130 and 131 are disposed so that the longitudinal direction of the magneto-impedance device 110 coincides with the longitudinal direction of the core sections 130 and 131.

In this embodiment, the core sections 130 and 131 are formed of mu-metal having a permeability of about 10,000. The core sections 130 and 131 have a length in the longitudinal direction of about 12 cm and a diameter of about 5 mm. This makes it possible to increase the sensitivity of the magnetic field sensor by a factor of about 300 as compared with the case where the core sections 130 and 131 are not provided.

Figure 4:
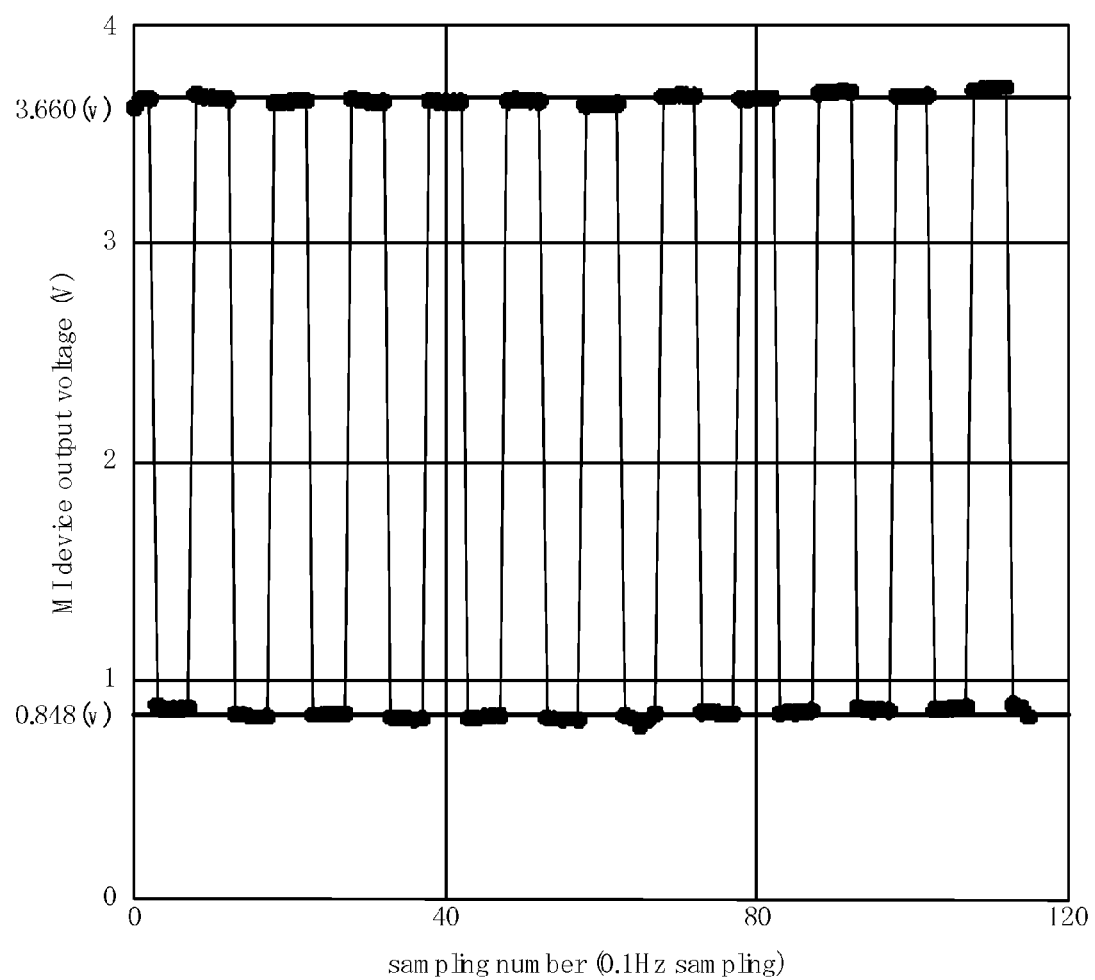
FIG. 4 is a graph illustrating an experimental example for confirming an increase in sensitivity.

FIG. 4 is a graph illustrating an experimental example that confirms an increase in sensitivity due to the core sections 130 and 131. In the experiment, a magnetic field sensor device of which the sensitivity obtained by the combination of the magneto-impedance device 110 and the driver circuit 120 was 0.0048 mV/nT was used.

The core sections 130 and 131 are provided in the magnetic field sensor device, and an output voltage when inputting a magnetic field having a magnetic field strength of 1727.6 nT was measured (see FIG. 4). As illustrated in FIG. 4, the output voltage of the magnetic field sensor device was 2.812 V (=3.660−0.848 V). Therefore, the sensitivity amplification factor achieved by providing the core sections 130 and 131 was 327.7 (=(2.812×1000/0.0048)/1727.6).

As described above, the sensitivity of the magnetic field sensor device can be improved by providing the rod-shaped core sections 130 and 131. Moreover, a magnetic field sensor device that can be reduced in size and weight as compared with an induction coil can be implemented.

The sensor section 100 may include environmental magnetic field cancellation means 140 and 141 that generate a correction magnetic field that cancels the environmental magnetic field input to the magnetic amorphous structure of the magneto-impedance device 110. In this embodiment, each of the environmental magnetic field cancellation means 140 and 141 is formed by a coil that is wound around the core section 130 or 131.

The magnetic field sensor device 1 may include an adjustment means that controls the environmental magnetic field cancellation means 140 and 141 so that the observational data falls within the desired range. In this embodiment, the processing section 200 has the function of the adjustment means. A configuration example of the processing section 200 is described later.

The magneto-impedance device 110 detects the magnitude of a magnetic field instead of a change (temporal differentiation) in magnetic field. The environmental magnetic field due to terrestrial magnetism normally exists at a magnetic flux density of about 0.5 gauss. Therefore, when the detection sensitivity is increased by a factor of 300 using the core sections 130 and 131, for example, the magneto-impedance device 110 detects the environmental magnetic field at a magnetic flux density of about 150 gauss.

The detection range of the magnetic field sensor device is determined by a combination of the magneto-impedance device 110 and the driver circuit 120. A magnetic field sensor device formed by combining a commercially available magneto-impedance device 110 and a commercially available driver circuit 120 may be designed to have a detection range of ±3 gauss (magnetic flux density), for example. In this case, if the detection sensitivity is increased by a factor of 300 using the core sections 130 and 131, the driver circuit 120 is saturated only by the environmental magnetic field due to terrestrial magnetism so that a magnetic field cannot be measured.

However, the observational data falls within the detection range determined by the combination of the magneto-impedance device 110 and the driver circuit 120 by causing the environmental magnetic field cancellation means 140 and 141 to cancel the environmental magnetic field input to the magnetic amorphous structure of the magneto-impedance device 110.

In particular, when the observation target magnetic field signal is lower than the environmental magnetic field signal due to terrestrial magnetism, the magnetic field signal can be measured with high accuracy by causing the environmental magnetic field cancellation means 140 and 141 to cancel the environmental magnetic field so that the environmental magnetic field level due to terrestrial magnetism corresponds to the center of the detection range.

The environmental magnetic field is canceled by causing the environmental magnetic field cancellation means 140 and 141 to generate a magnetic field opposite to the environmental magnetic field due to terrestrial magnetism. In particular, the environmental magnetic field can be canceled so that the environmental magnetic field level due to terrestrial magnetism corresponds to the center of the detection range by causing the environmental magnetic field cancellation means 140 and 141 to generate a magnetic field that is opposite to the environmental magnetic field due to terrestrial magnetism and has a magnitude almost equal to that of the environmental magnetic field due to terrestrial magnetism.

Figure 6:
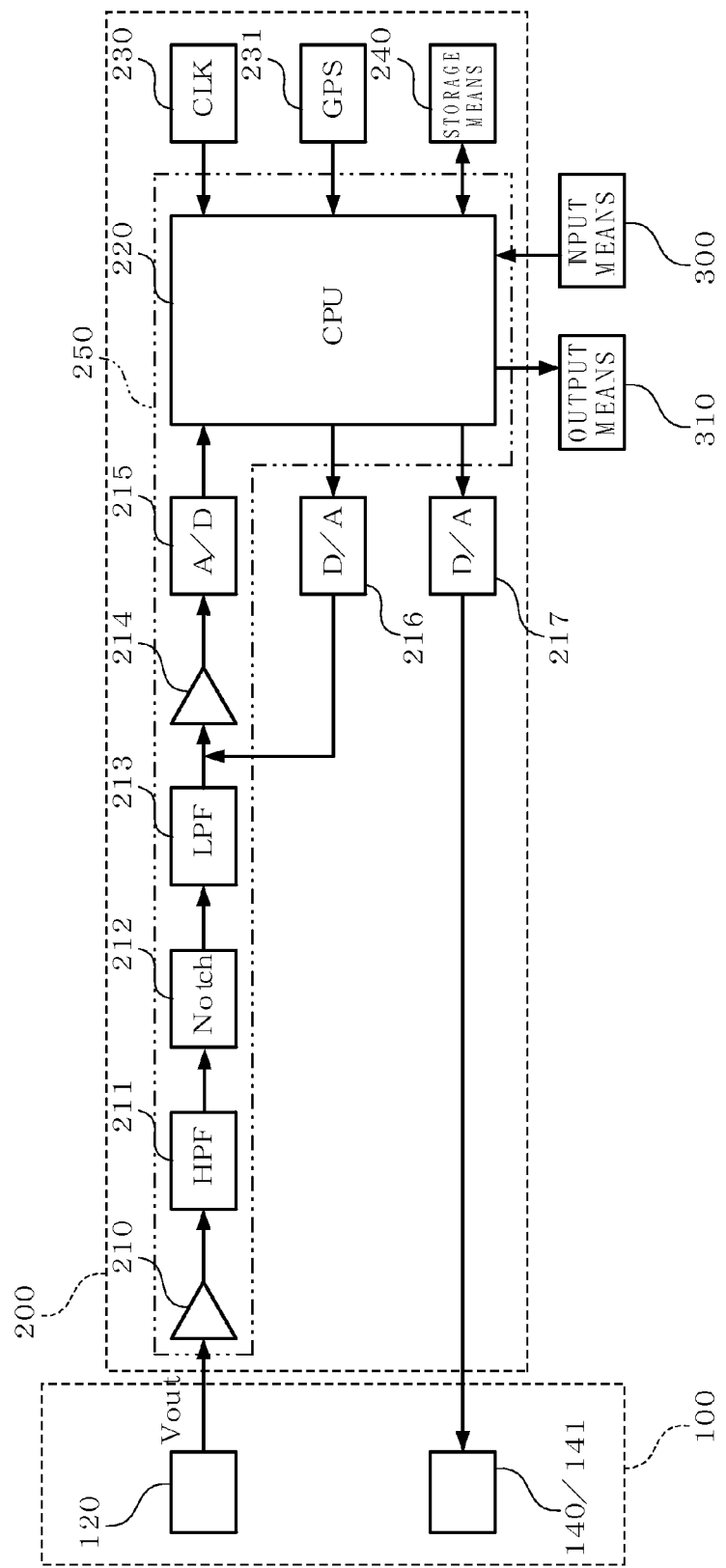
FIG. 6 is a circuit block diagram illustrating an example of the configuration of a recording section.

FIG. 6 is a circuit block diagram illustrating an example of the configuration of the processing section 200.

The processing section 200 may include a processing unit 220. The processing unit 220 acquires the observational data, controls the environmental magnetic field cancellation means 140 and 141, writes the observational data into a storage means 240 described later, and performs various calculation processes and the like.

The processing unit 200 may function as an adjustment means that controls the environmental magnetic field cancellation means 140 and 141 via a D/A converter 217.

The processing section 200 receives the output signal Vout from the driver circuit 120. The output signal Vout is input to the processing unit 220 via an amplifier 210, a high-pass filter 211, a notch filter 212, a low-pass filter 213, an amplifier 214, and an A/D converter 215, as required. For example, the notch filter 212 may block environmental noise (e.g., 50 Hz or 60 Hz) caused by a power supply, or the low-pass filter 213 may block a signal having a frequency equal to or higher than twice a sampling frequency.

The processing section 200 may include a precision clock 230. The precision clock 230 may have a precision of $10^{-9}$, for example.

In this embodiment, the processing unit 220 and the precision clock 230 function as an observation means 250 that serially observes a desired magnetic field optionally together with the amplifier 210, the high-pass filter 211, the notch filter 212, the low-pass filter 213, the amplifier 214, and the A/D converter 215. For example, when using the magnetic field sensor device 1 according to the embodiment for underground electromagnetic exploration that utilizes an induced current generating transmitter, the observation means 250 serially observes a magnetic field including a magnetic field signal based on the output from the induced current generating transmitter.

The processing section 200 may include the storage means 240. The storage means 240 stores the observational data observed by the observation means 250. The storage means 240 may be removable (e.g., memory card), or may be formed by a hard disk or the like provided in the processing section 200. When observational data that is higher or lower than a measurable range determined by the dynamic range of an amplifier means (i.e., the amplifier 214 in this embodiment) that amplifies the output signal from the sensor section 100 has been input, the observational data may be stored in the storage means 240 as the maximum value and the minimum value of the measurable range.

The processing unit 220 may function as a correction means that corrects a reference value of the observational data so that the observational data falls within the desired range based on a value obtained by integrating the observational data stored in the storage means 240 for a period in which the integral value of the magnetic field signal based on the output from the induced current generating transmitter is zero.

When the induced current generating transmitter outputs an alternating direct current (i.e., a signal of which the positive output in the first period of the cycle is symmetrical with the negative output in the second period of the cycle), for example, the period in which the integral value of the magnetic field signal based on the output from the induced current generating transmitter is zero may be a period equal to an integral multiple of the output cycle of the induced current generating transmitter, or may be the combination of a first interval and a third interval or the combination of a second interval and a fourth interval when equally dividing the output cycle into the first to fourth intervals.

The correction means may automatically control the reference value of the observational data by controlling the offset amount of the amplifier means that amplifies the output signal from the sensor section 100, for example. In this embodiment, the amplifier 214 functions as the amplifier means that amplifies the output voltage Vout from the sensor section 100, and the processing unit 220 controls the reference value of the observational data by controlling the offset amount of the amplifier 214 via the D/A converter 216.

For example, when using the magnetic field sensor device 1 according to the embodiment for underground electromagnetic exploration that utilizes the induced current generating transmitter, the correction means may decrease the reference value of the measurement data when a value obtained by integrating the observational data stored in the storage means 240 for a period equal to an integral multiple of the output cycle has exceeded the upper limit reference value, and increase the reference value of the measurement data when a value obtained by integrating the observational data for a period equal to an integral multiple of the output cycle has become lower than the lower limit reference value.

According to this configuration, since the amount of temporal change in observational data due to a temporal change in terrestrial magnetism can be automatically corrected, the sensor section 100 and the observation means 250 are not saturated. This enables an automatic measurement.

When using the magnetic field sensor device 1 according to the embodiment for underground electromagnetic exploration that utilizes the induced current generating transmitter, the processing section 200 may include a synchronization means that acquires time data synchronized with the output from the induced current generating transmitter. In this embodiment, the synchronization means may acquire the time data synchronized with the output from the induced current generating transmitter by acquiring time information included in global positioning system (GPS) information using a global positioning system (GPS) clock 231.

The storage means 240 may store the observational data and the time data while associating the observational data with the time data. This facilitates analysis of the observational data when using the magnetic field sensor device 1 for underground electromagnetic exploration.

The processing section 200 may be connected to an input means 300 and an output means 310. The input means 300 and the output means 310 are used to input and output instructions and data. The input means 300 may be a keyboard. The output means 310 may be a display (monitor).

2. Underground Electromagnetic Exploration Method using Magnetic Field Sensor Device 1

An underground electromagnetic exploration method using the magnetic field sensor device 1 is described below. Various underground electromagnetic exploration methods have been developed. This embodiment illustrates an underground electromagnetic exploration method that artificially generates an electromagnetic field underground to implement underground exploration.

As the underground electromagnetic exploration method, a frequency-domain underground electromagnetic exploration method that handles an electromagnetic response as a function of frequency and a time-domain underground electromagnetic exploration method that handles an electromagnetic response as a function of time, have been known. The frequency domain and the time domain make a Fourier transform pair and are theoretically equivalent. This embodiment illustrates a time-domain electromagnetic method (TDEM method) that is a time-domain underground electromagnetic exploration method.

Figure 7:
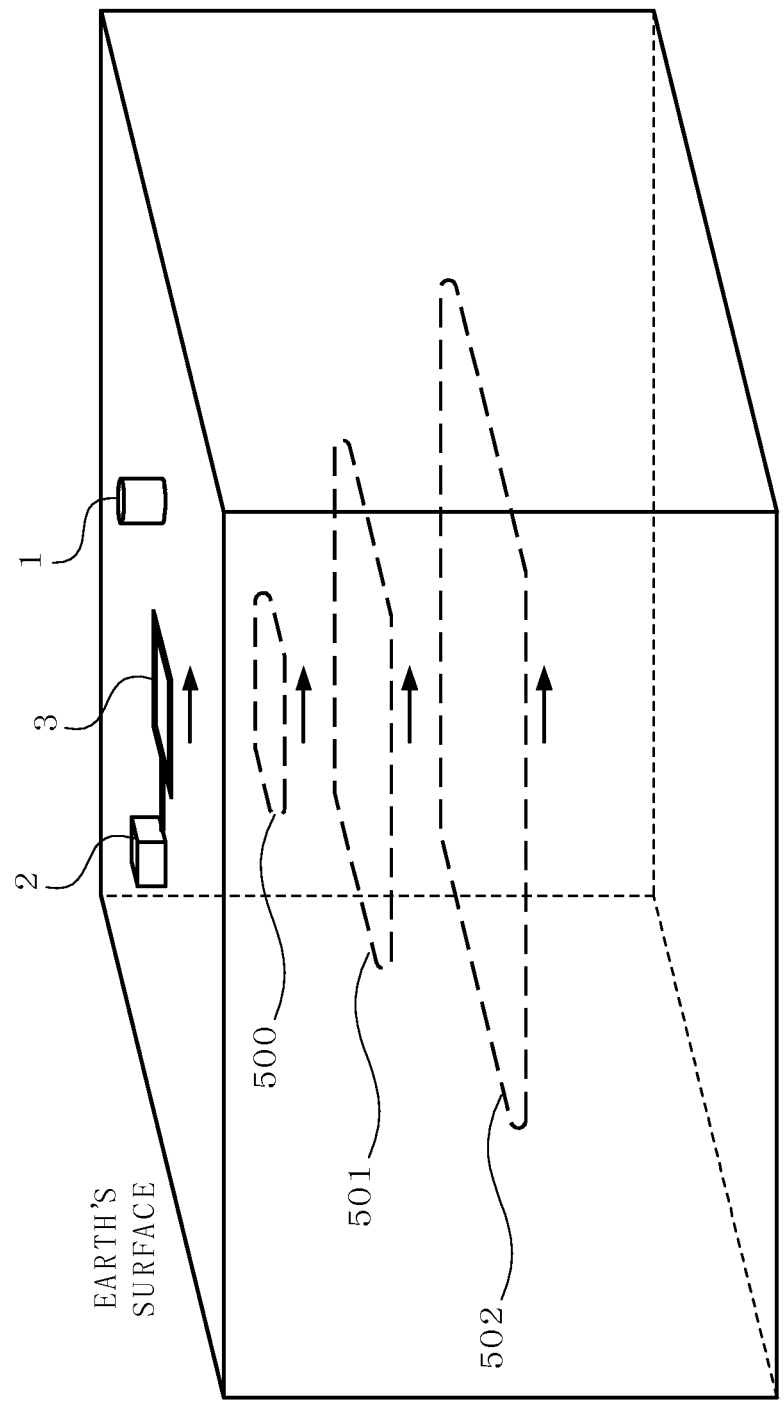
FIG. 7 is a schematic view illustrating an arrangement example when using a magnetic field sensor device for underground electromagnetic exploration.

FIG. 7 is a schematic view illustrating an arrangement example when using the magnetic field sensor device 1 for underground electromagnetic exploration.

The magnetic field sensor device 1 is disposed on the earth's surface. The magnetic field sensor device 1 is disposed in a depression formed in the earth's surface in order to secure the position and the inclination of the magnetic field sensor device 1.

An induced current generating transmitter 2 is disposed on the earth's surface. A transmission loop 3 used to generate an induced current underground by causing an output current from the induced current generating transmitter 2 to flow is also disposed on the earth's surface. In this embodiment, an induced current is generated underground using the induced current generating transmitter 2 and the transmission loop 3. The distance between the magnetic field sensor device 1 and the transmission loop 3 may be arbitrarily set corresponding to the objective of underground electromagnetic exploration. In this embodiment, the magnetic field sensor device 1 is disposed at a distance of about 0 to 15 km from the transmission loop 3.

Figure 8:
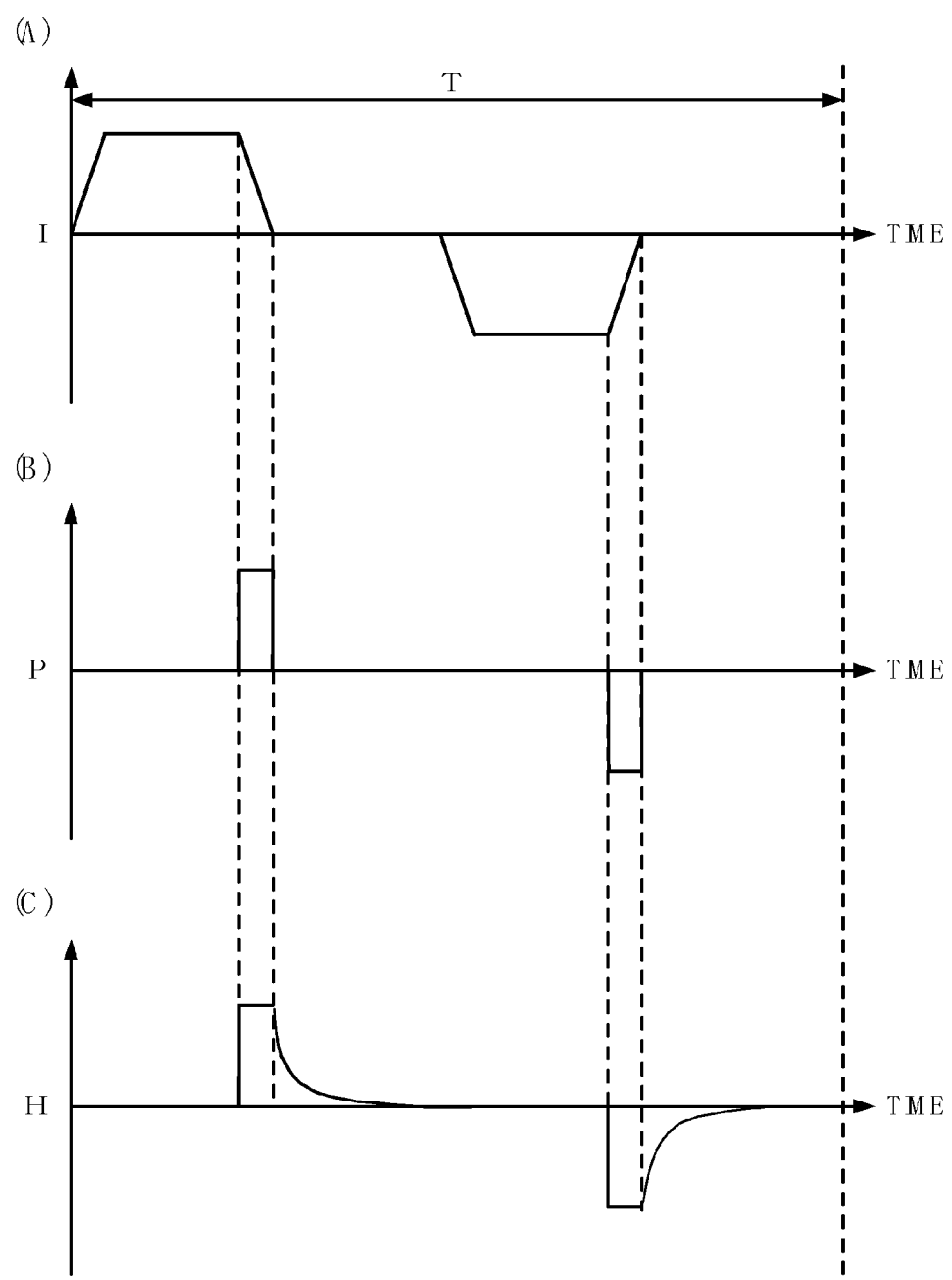
FIG. 8 is a timing chart illustrating an output current from an induced current generating transmitter, a counterelectromotive force, and a magnetic field in an underground electromagnetic exploration method according to one embodiment of the invention.

FIG. 8 is a timing chart illustrating an output current I from the induced current generating transmitter 2, a counterelectromotive force P after the output current has been cut, and a magnetic field H after the output current has been cut in the underground electromagnetic exploration method according to the embodiment. The output current I is an alternating direct current (i.e., a signal of which the positive output in the first period of the cycle is symmetrical with the negative output in the second period of the cycle). The direction indicated by an arrow in FIG. 7 is a positive direction.

As illustrated in (A) of FIG. 8, a positive output current I is output to the transmission loop 3 from the induced current generating transmitter 2. The output current I is then rapidly cut. As a result, a counterelectromotive force that maintains the magnetic field before the output current I is cut according to the law of electromagnetic induction is generated, as illustrated in (B) of FIG. 8, so that an induced current is generated on the earth's surface. A negative output current I is then output to the transmission loop 3 from the induced current generating transmitter 2. The output current I is then rapidly cut. The above operation is repeated in a cycle T.

The induced current on the earth's surface attenuates corresponding to the specific resistivity of the earth, and an induced current that prevents a change in current occurs underground. This process repeats so that a phenomenon in which an induced current 500 propagates deep underground as an induced current 501 and an induced current 502 occurs.

The induced current attenuates corresponding to the specific resistivity of the current path stratum. Therefore, the underground specific resistivity distribution can be determined by detecting the attenuation of the induced current as a temporal change in magnetic field, as illustrated in (C) of FIG. 8, using the magnetic field sensor device 1 disposed on the earth's surface. For example, the induced current rapidly attenuates when the underground specific resistivity is high, whereas the induced current slowly attenuates when the underground specific resistivity is low.

Therefore, the underground specific resistivity distribution can be determined by collecting observational data using the magnetic field sensor device 1 that is moved corresponding to the measurement point or a plurality of magnetic field sensor devices 1 disposed at the corresponding measurement points, and analyzing the observational data. The underground structure can also be determined based on the specific resistivity distribution.

Specifically, the underground structure can be determined by repeating magnetic field observation that includes an observation step that observes the magnetic field based on the induced current using the magnetic field sensor device 1 and a storage step that stores the magnetic field observational data based on the induced current at a plurality of measurement points on the earth's surface, and calculating the underground specific resistivity distribution based on the observational data corresponding to each measurement point.

Since a magnetic field sensor device that can be reduced in size and weight as compared with an induction coil can be implemented by utilizing the magnetic field sensor device 1 that includes the sensor section 100 including the magneto-impedance device 110 having the magnetic amorphous structure as the core and the rod-shaped core sections 130 and 131 that guide a magnetic field to the magnetic amorphous structure in the longitudinal direction of the magnetic amorphous structure, underground electromagnetic exploration that enables inexpensive measurements at a number of locations in a short period of time can be implemented.

When the magnetic field sensor device 1 includes the environmental magnetic field cancellation means 140 and 141 that generates a correction magnetic field that cancels the environmental magnetic field input to the magnetic amorphous structure, the method may include an environmental magnetic field cancellation step that generates a correction magnetic field that cancels the environmental magnetic field input to the magnetic amorphous structure so that the magnetic field observational value falls within the desired range. The environmental magnetic field cancellation step may be performed before the observation step, for example.

Figure 9:
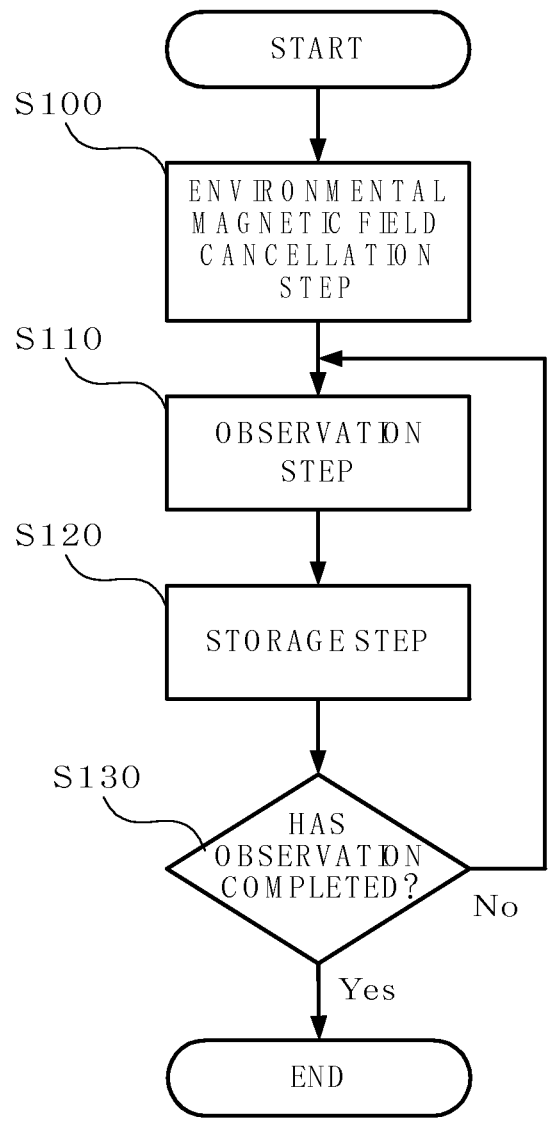
FIG. 9 is a flowchart illustrating an example of the magnetic field observation flow using an underground electromagnetic exploration method according to one embodiment of the invention.

FIG. 9 is a flowchart illustrating an example of the magnetic field observation flow using the underground electromagnetic exploration method according to this embodiment.

The environmental magnetic field cancellation step that generates a correction magnetic field that cancels the environmental magnetic field input to the magnetic amorphous structure using the environmental magnetic field cancellation means 140 and 141 so that the magnetic field observational value falls within the desired range is performed (step S100).

The observation step that observes the magnetic field based on the induced current using the observation means 250 is performed (step S110). The storage step that stores the observational data in the storage means 240 is then performed (step S120).

Whether or not magnetic field observation has completed is determined (step S130). Whether or not magnetic field observation has completed may be determined based on whether or not the observation step has been performed a given number of times, whether or not the observation step has been performed for a given period of time, or whether or not an observation finish instruction has been input, for example.

When it has been determined that magnetic field observation has not completed in the step S130, the steps S110 to S130 are repeated until magnetic field observation is completed. When it has been determined that magnetic field observation has completed in the step S130, the magnetic field observation flow is terminated.

Figure 10:
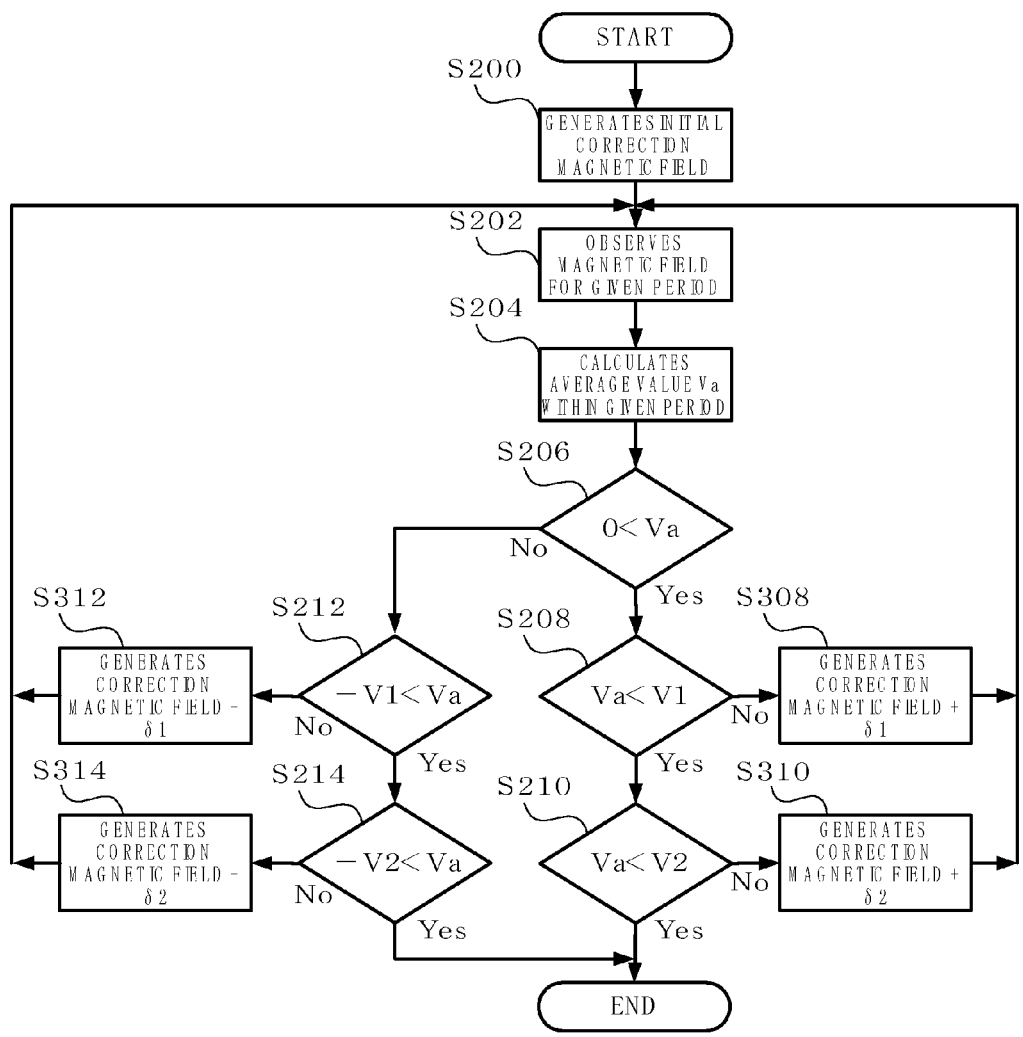
FIG. 10 is a flowchart illustrating an example of the flow of an environmental magnetic field cancellation step of an underground electromagnetic exploration method according to one embodiment of the invention.

FIG. 10 is a flowchart illustrating an example of the flow of the environmental magnetic field cancellation step of the underground electromagnetic exploration method according to this embodiment. In this embodiment, reference voltages V1 and V2 satisfy the relationship "0<V2<V1", and correction magnetic field change widths delta1 and delta2 satisfy the relationship "0<delta2<delta1". The direction of the correction magnetic field opposite to terrestrial magnetism is referred to as a positive direction. The change width and the number of change stages of the correction magnetic fields may be arbitrarily set, as required.

When the environmental magnetic field cancellation step has started, the environmental magnetic field cancellation means 140 and 141 generates the correction magnetic field at a predetermined initial value (step S200). The initial value may be zero (i.e., a state in which the correction magnetic field is not generated).

The observation means 250 of the magnetic field sensor device 1 observes a magnetic field for a given period of time (step S202). An average value Va of the observational data stored in the storage means 240 is calculated based on the output voltage Vout from the driver circuit 120 of the sensor section 100 output within the given period of time (step S204). The average value Va is calculated by the processing unit 220 of the processing section 200, for example. When observational data that is higher or lower than a measurable range determined by the dynamic range of an amplifier means (i.e., the amplifier 214 in this embodiment) that amplifies the output signal from the sensor section 100 has been input, the observational data may be stored in the storage means 240 as the maximum value and the minimum value of the measurable range.

Whether or not the average value Va is larger than zero is determined (step S206). The following description is given on the assumption that the processing unit 220 performs all of the determination processes.

When the processing unit 220 has determined that the average value Va is larger than zero in the step S206, the processing unit 220 determines whether or not the average value Va is smaller than the reference voltage V1 (step S208). When the processing unit 220 has determined that the average value Va is equal to or larger than the reference voltage V1, the processing unit 220 increases the magnitude of the correction magnetic field by the change width delta1 (step S308), and returns to the step S202.

When the processing unit 220 has determined that the average value Va is smaller than the reference voltage V1 in the step S208, the processing unit 220 determines whether or not the average value Va is smaller than the reference voltage V2 (step S210). When the processing unit 220 has determined that the average value Va is equal to or larger than the reference voltage V2, the processing unit 220 increases the magnitude of the correction magnetic field by the change width delta2 (step S310), and returns to the step S202.

When the processing unit 220 has determined that the average value Va is smaller than the reference voltage V2 in the step S210, the processing unit 220 fixes the magnitude of the correction magnetic field, and finishes the process. Specifically, the average value Va satisfies the relationship "0<Va<V2" when the process is completed.

When the processing unit 220 has determined that the average value Va is equal to or smaller than zero in the step S206, the processing unit 220 determines whether or not the average value Va is larger than the reference voltage (−V1) (step S212). When the processing unit 220 has determined that the average value Va is equal to or smaller than the reference voltage (−V1), the processing unit 220 decreases the magnitude of the correction magnetic field by the change width delta1 (step S312), and returns to the step S202.

When the processing unit 220 has determined that the average value Va is larger than the reference voltage (−V1) in the step S212, the processing unit 220 determines whether or not the average value Va is larger than the reference voltage (−V2) (step S214). When the processing unit 220 has determined that the average value Va is equal to or smaller than the reference voltage (−V2), the processing unit 220 decreases the magnitude of the correction magnetic field by the change width delta2 (step S314), and returns to the step S202.

When the processing unit 220 has determined that the average value Va is larger than the reference voltage (−V2) in the step S214, the processing unit 220 fixes the magnitude of the correction magnetic field, and finishes the process. Specifically, the average value Va satisfies the relationship "−V2<Va<0" when the process is completed.

Specifically, the average value Va satisfies the relationship "−V2<Va<V2" when the flow of the environmental magnetic field cancellation step illustrated in FIG. 10 is completed. The magnitude of the correction magnetic field is changed by the large change width delta1 when the average value Va differs from zero to a large extent, and is changed by the small change width delta2 when the average value Va has fallen within the range "−V1<Va<V1". This makes it possible to determine the magnitude of the correction magnetic field that rapidly and accurately causes the average value Va to fall within the range "−V2<Va<V2".

Figure 11:
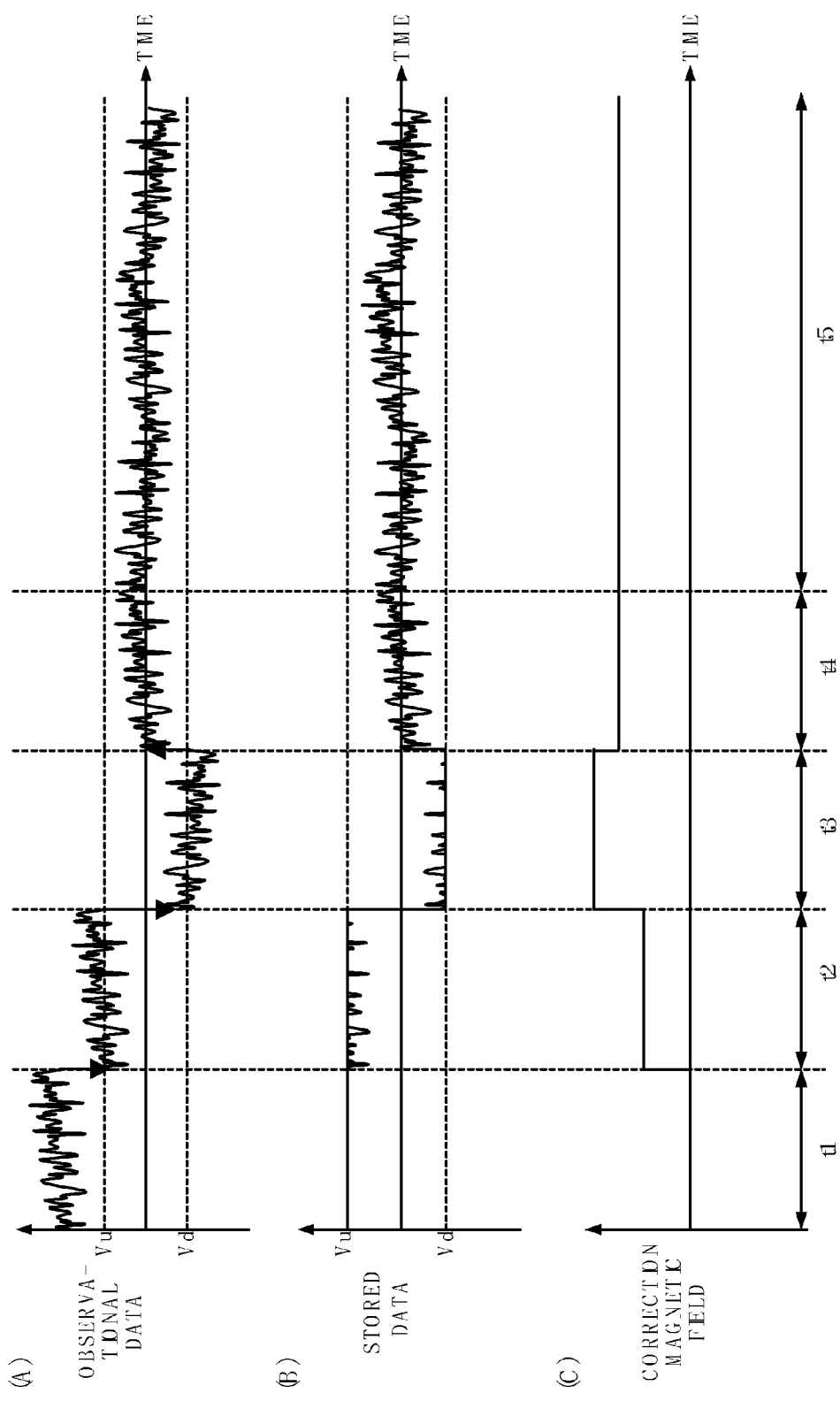
FIG. 11 is a graph illustrating an example of an experimental example for determining the magnitude of a correction magnetic field.

FIG. 11 is a schematic diagram illustrating determination of the magnitude of the correction magnetic field based on the flow of FIG. 10. (A) of FIG. 11 illustrates the observational data input to the processing unit 220, (B) of FIG. 11 illustrates the data stored in the storage means 240, and (C) of FIG. 11 illustrates the magnitude of the correction magnetic field. In (A) to (C) of FIG. 11, the horizontal axis indicates time. The measurement upper limit value of the magnetic field sensor device 1 is referred to as Vu, and the measurement lower limit value of the magnetic field sensor device 1 is referred to as Vd. The relationship "Vd<−V1<−V2<0<V2<V1<Vu" is satisfied.

The correction magnetic field at the predetermined initial value is generated by the environmental magnetic field cancellation means 140 and 141 in a period t1, and the magnetic field is observed by the observation means 250 of the magnetic field sensor device 1 for a given period of time (steps S200 and S202). In the example of FIG. 11, the initial value of the correction magnetic field is zero (i.e., a state in which the correction magnetic field is not generated).

In the example in (A) of FIG. 11, all of the observational data is equal to or larger than the measurement upper limit value Vu in the period t1. Therefore, since all of the stored data is Vu, the average value Va satisfies the relationship "0<V1<Va". Therefore, the processing unit 220 increases the correction magnetic field by the change amount delta1 (steps S204, S206, S208, and S308).

The correction magnetic field that has been changed based on the observation results in the period t1 is generated by the environmental magnetic field cancellation means 140 and 141 in a period t2, and the magnetic field is observed by the observation means 250 of the magnetic field sensor device 1 for a given period of time (step S202).

In the period t2, some of the observational data is equal to or larger than the measurement upper limit value Vu. In the example of FIG. 11, the average value Va satisfies the relationship "0<V1<Va". Therefore, the processing unit 220 also increases the correction magnetic field by the change amount delta1 (steps S204, S206, S208, and S308).

The correction magnetic field that has been changed based on the observation results in the period t2 is generated by the environmental magnetic field cancellation means 140 and 141 in a period t2, and the magnetic field is observed by the observation means 250 of the magnetic field sensor device 1 for a given period of time (step S202).

In the period t3, some of the observational data is equal to or smaller than the measurement lower limit value Vd. In the example of FIG. 11, the average value Va satisfies the relationship "−V1<Va<0". In this case, the processing unit 220 decreases the correction magnetic field by the change amount delta2 (steps S204, S206, S212, S214, and S314).

The correction magnetic field that has been changed based on the observation results in the period t3 is generated by the environmental magnetic field cancellation means 140 and 141 in a period t4, and the magnetic field is observed by the observation means 250 of the magnetic field sensor device 1 for a given period of time (step S202).

In the period t4, all of the observational data falls within the range between the measurement lower limit value Vd and the measurement upper limit value Vu. In the example of FIG. 11, the average value Va satisfies the relationship "0<Va<V2". In this case, the processing unit 220 fixes the magnitude of the correction magnetic field, and finishes the environmental magnetic field cancellation step (steps S204, S206, S208, and S210). The environmental magnetic field cancellation means 140 and 141 generate the correction magnetic field having the same magnitude as in the period t4 in the subsequent period t5.

The observation target magnetic field can be efficiently observed by thus canceling the environmental magnetic field. Moreover, the environmental magnetic field cancellation step can be easily automated.

The underground electromagnetic exploration method according to this embodiment may further include a correction step that corrects the reference value of the observational data so that the observational data falls within the desired range based on a value obtained by integrating the magnetic field observational data including the magnetic field signal based on the output from the induced current generating transmitter for a period in which the integral value of the magnetic field signal based on the output from the induced current generating transmitter is zero.

When the induced current generating transmitter outputs an alternating direct current (i.e., a signal of which the positive output in the first period of the cycle is symmetrical with the negative output in the second period of the cycle), for example, the period in which the integral value of the magnetic field signal based on the output from the induced current generating transmitter is zero may be a period equal to an integral multiple of the output cycle of the induced current generating transmitter, or may be the combination of a first interval and a third interval or the combination of a second interval and a fourth interval when equally dividing the output cycle into the first to fourth intervals.

The correction step may automatically control the reference value of the observational data by causing the correction means included in the magnetic field sensor device 1 to control the offset amount of the amplifier means that amplifies the output signal from the sensor section 100, for example. In this embodiment, the amplifier 214 functions as the amplifier means that amplifies the output voltage Vout from the sensor section 100, and the processing unit 220 controls the reference value of the observational data by controlling the offset amount of the amplifier 214 via the D/A converter 216.

For example, when using the magnetic field sensor device 1 according to the embodiment for underground electromagnetic exploration that utilizes the induced current generating transmitter, the correction means may decrease the reference value of the measurement data when a value obtained by integrating the observational data stored in the storage means 240 for a period equal to an integral multiple of the output cycle of the induced current generating transmitter 2 has exceeded the upper limit reference value, and may increase the reference value of the measurement data when a value obtained by integrating the observational data for a period equal to an integral multiple of the output cycle of the induced current generating transmitter 2 has become lower than the lower limit reference value.

The reference value of the observational data may be controlled in a period in which the induced current generating transmitter 2 supplies the output current to the transmission loop 3, for example.

Figure 12:
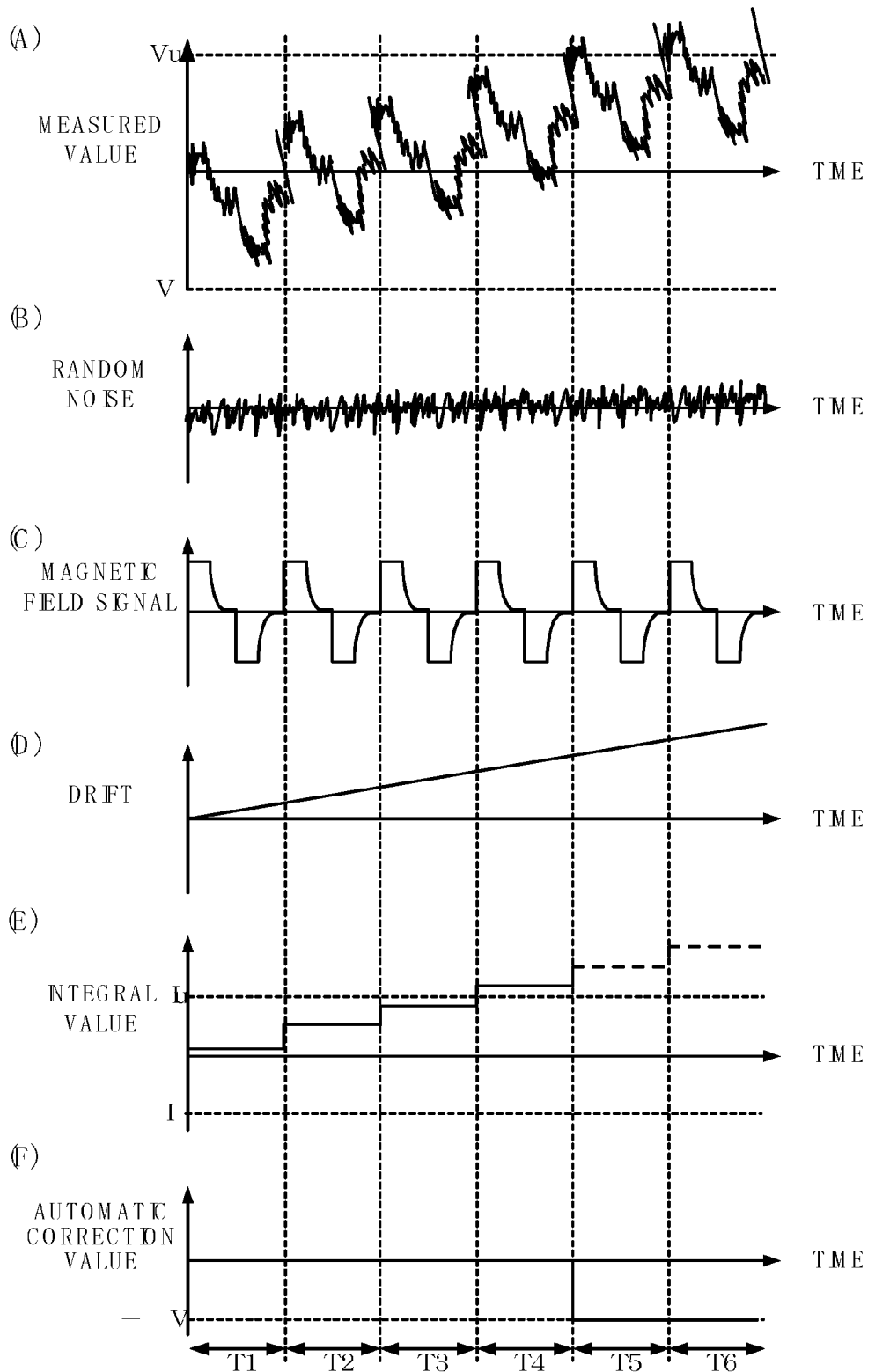
FIG. 12 schematically illustrates a correction step.
Figure 13:
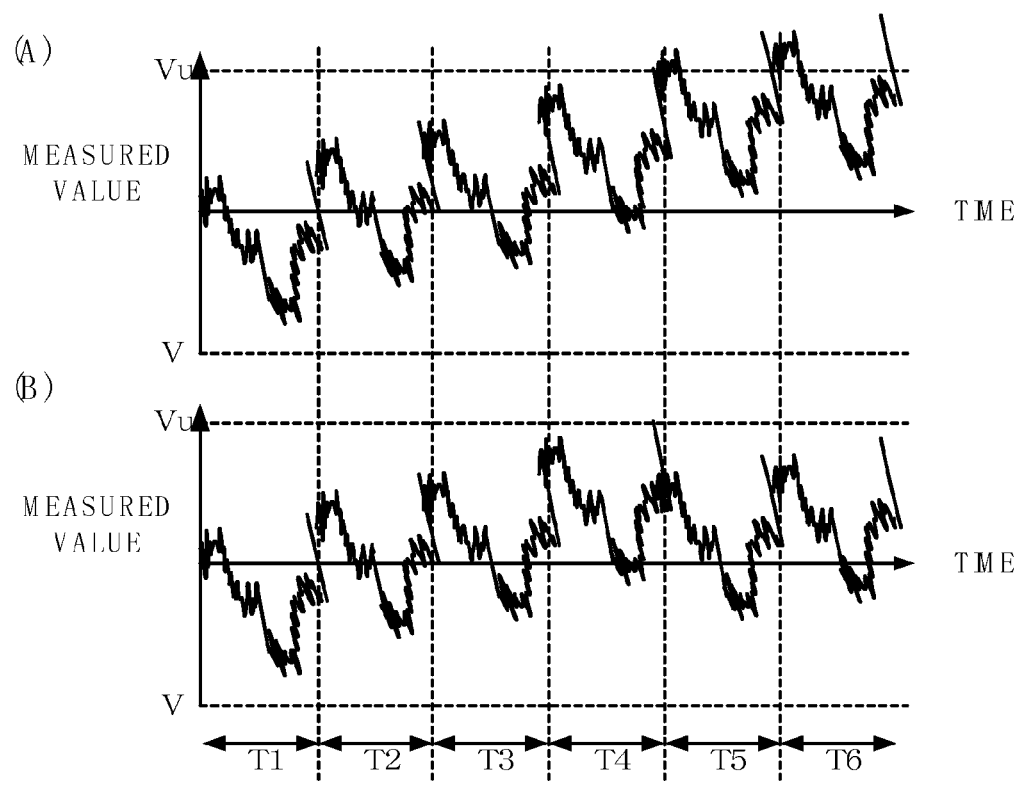
FIG. 13 schematically illustrates a correction step.

FIG. 12 and FIG. 13 are schematic diagrams illustrating the correction step. The horizontal axis indicates time. The integration period is identical with the output cycle of the induced current generating transmitter 2.

(A) of FIG. 12 illustrates the observational data before performing the correction step. The observational data is considered to include random noise illustrated in (B) of FIG. 12, a magnetic field signal based on the output from the induced current generating transmitter 2 illustrated in (C) of FIG. 12, and a drift amount due to a temporal change in terrestrial magnetism, the circuit of the observation means 250, and the like illustrated in (D) of FIG. 12.

The random noise in (B) of FIG. 12 and the magnetic field signal based on the output from the induced current generating transmitter 2 in (C) of FIG. 12 become zero as a result of integration in the output cycle of the induced current generating transmitter 2. Therefore, only an integral value of the drift amount due to a temporal change in terrestrial magnetism, the circuit of the observation means 250, and the like in (D) of FIG. 12 can be calculated by integrating the observational data in (A) of FIG. 12 in the output cycle of the induced current generating transmitter 2.

The correction means changes the reference value of the observational data when the integral value has exceeded an upper limit reference value Iu or has become lower than a lower limit reference value Id. The upper limit reference value Iu and the lower limit reference value Id are determined so that the observational data falls within the range between the measurement upper limit value Vu and the measurement lower limit value Vd taking account of the magnitude of the random noise and the integration period. In the example illustrated in (E) of FIG. 12, the integral value exceeds the upper limit reference value Iu in a period T4. Therefore, as illustrated in (F) of FIG. 12, the correction means decreases the reference value of the observational data by DELTAV in a period T5 and the subsequent period.

(A) of FIG. 13 illustrates the same observational data as in (A) of FIG. 12, and (B) of FIG. 13 illustrates the same observational data after performing the correction step. The observational data in (A) of FIG. 13 includes data that exceeds the measurement upper limit value Vu in the period T5 and the subsequent period. However, as illustrated in (B) of FIG. 13, the measurement data falls within the range between the measurement upper limit value Vu and the measurement lower limit value Vd by performing the correction step.

The underground electromagnetic exploration method according to this embodiment may include a synchronization step that acquires time data synchronized with the output from the induced current generating transmitter 2, and the storage step (step S120 in FIG. 9) may store the observational data and the time data while associating the observational data with the time data. The synchronization step may be performed before the observation step (step S110 in FIG. 9), or may be performed during the observation step, for example.

In this embodiment, time data in which the magnetic field sensor device 1 is synchronized with the output from the induced current generating transmitter 2 may be acquired by providing a global positioning system (GPS) clock in each of the magnetic field sensor device 1 and the induced current generating transmitter 2, and causing each of the magnetic field sensor device 1 and the induced current generating transmitter 2 to acquire time information included in global positioning system (GPS) information.

The observational data can be easily analyzed by storing the observational data and the time data in which the magnetic field sensor device 1 is synchronized with the output from the induced current generating transmitter 2 while associating the observational data with the time data.

The underground electromagnetic exploration method according to this embodiment may include a stack step. In the stack process, data obtained by summing up the observational data in the first period of the output cycle T of the induced current generating transmitter 2 and the sign-inversion data of the observational data in the second period of the output cycle T is averaged corresponding to a plurality of cycles.

Figure 14:
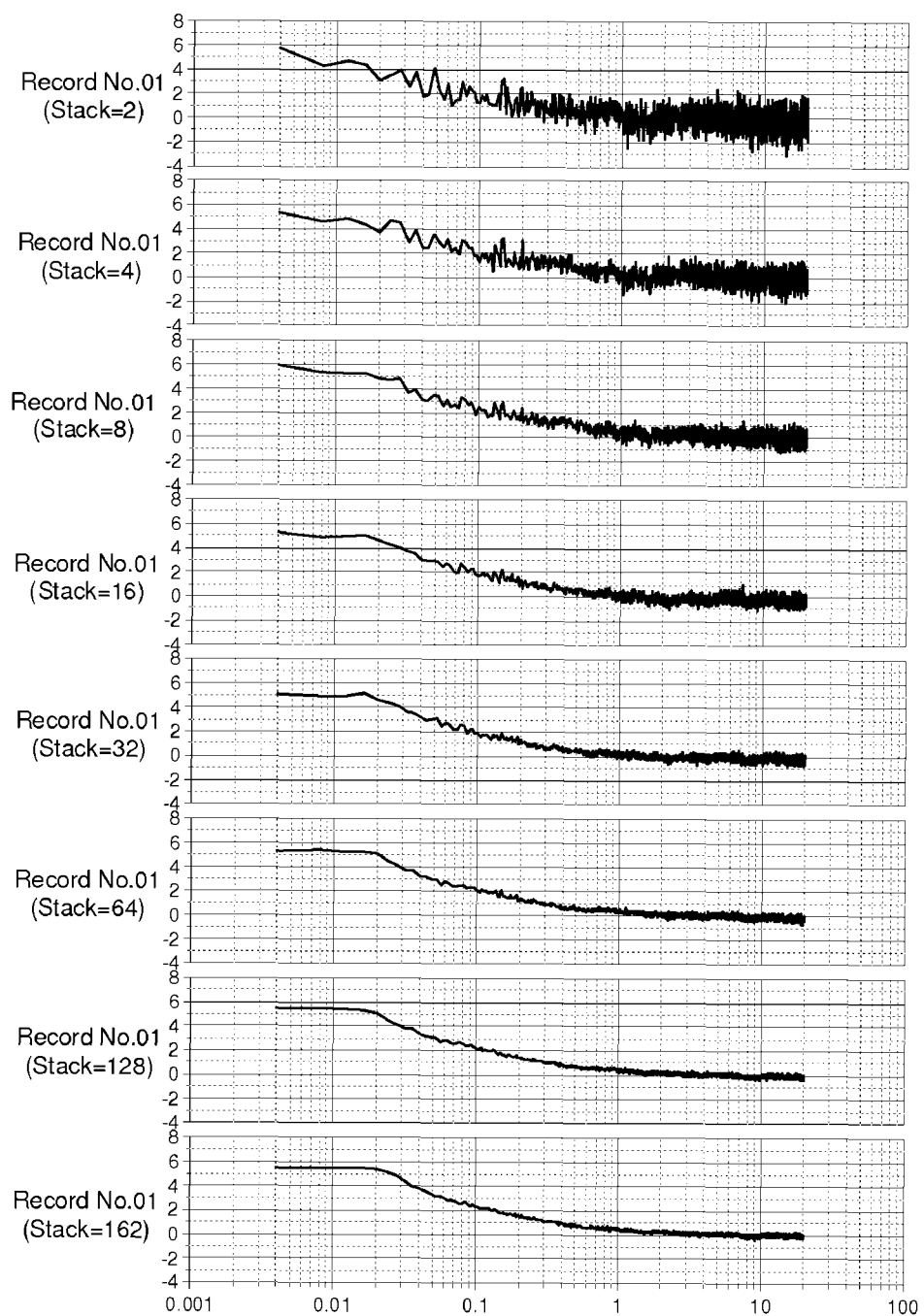
FIG. 14 is a graph illustrating an example of data after performing a stack step.

FIG. 14 is a graph illustrating an example of data after performing the stack step. FIG. 14 illustrates data obtained by the stack step using the observational data corresponding to one cycle, two cycles, four cycles, eight cycles, 16 cycles, 32 cycles, 64 cycles, and 81 cycles (in the order from the upper side). The noise level decreases by a factor of ½ each time the amount of observational data used for the stack process (i.e., the number of cycles) increases by a factor of four.

Random noise can be canceled by the stack step so that the measurement accuracy can be improved. Moreover, the measurement can be automatically finished by monitoring the noise level after the stack step.

The invention includes configurations that are substantially the same as the configurations described in the above embodiments (e.g., in function, method and effect, or objective and effect). The invention also includes a configuration in which an unsubstantial element of the above embodiments is replaced by another element. The invention also includes a configuration having the same effects as those of the configurations described relating to the above embodiments, or a configuration capable of achieving the same object as those of the above-described configurations. The invention further includes a configuration obtained by adding known technology to the configurations described in the above embodiments.

For example, the induced current is generated using the transmission loop 3 in the above embodiments. Note that a plurality of electrodes may be disposed on the earth's surface, and an induced current may be generated by causing a current to flow between the electrodes through the earth.

The invention claimed is:

1. A magnetic field sensor device comprising:
   a sensor section that includes a magneto-impedance device having a magnetic amorphous structure;
   a rod-shaped core section that guides a magnetic field to the magnetic amorphous structure and is disposed in a longitudinal direction with resect to the magnetic amorphous structure;
   environmental magnetic field cancellation means that generates a correction magnetic field that cancels an environmental magnetic field due to terrestrial magnetism input to the magnetic amorphous structure;
   observation means that serially observes the magnetic field including a magnetic field signal based on an output from an induced current generating transmitter;
   storage means that stores observational data observed by the observation means; and
   correction means that corrects a reference value of the observational data so that the observational data falls within a desired range based on a value obtained by integrating the observational data stored in the storage means for a period in which an integral value of the magnetic field signal based on the output from the induced current generating transmitter is zero.

2. The magnetic field sensor device according to claim 1, wherein the core section is disposed on each side of the magnetic amorphous structure in the longitudinal direction.

3. The magnetic field sensor device according to claim 2, wherein the core section is disposed so that the longitudinal direction of the magnetic amorphous structure coincides with a longitudinal direction of the core section.

4. The magnetic field sensor device according to claim 1, wherein the core section is formed of a high-permeability material.

5. The magnetic field sensor device according to claim 4, wherein the high-permeability material is mu-metal.

6. The magnetic field sensor device according to claim 1, wherein the environmental magnetic field cancellation means is a coil that is wound around the core section.

7. The magnetic field sensor device according to claim 1, further comprising:
   adjustment means that controls the environmental magnetic field cancellation means so that observational data falls within the desired range.

8. The magnetic field sensor device according to claim 1, wherein the period in which the integral value of the magnetic field signal based on the output from the induced current generating transmitter is zero is a period equal to an integral multiple of an output cycle of the induced current generating transmitter that outputs an alternating direct current.

9. The magnetic field sensor device according to claim 1, further comprising:
   amplifier means that amplifies an output signal from the sensor section,
   wherein the correction means controls an offset amount of the amplifier means.

10. The magnetic field sensor device according to claim 1, further comprising:
    synchronization means that acquires time data synchronized with the output from the induced current generating transmitter,
    wherein the storage means stores the observational data and the time data while associating the observational data with the time data.

11. The magnetic field sensor device according to claim 10, wherein the synchronization means acquires the time data synchronized with the output from the induced current generating transmitter by acquiring time information included in GPS information.

12. The magnetic field sensor device according to claim 1, further comprising:
    stack means that performs a stack process that averages data obtained by summing up the observational data in a first period of an output cycle of the induced current generating transmitter and sign-inversion data of the observational data in a second period of the output cycle corresponding to a plurality of cycles,
    wherein the observation means stops observation based on a noise level of data after the stack process.

13. The magnetic field sensor device according to claim 2, wherein the core section is formed of a high-permeability material.

14. The magnetic field sensor device according to claim 3, wherein the core section is formed of a high-permeability material.

15. A magnetic field sensor device according comprising:
a sensor section that includes a magneto-impedance device having a magnetic amorphous structure;
a rod-shaped core section that guides a magnetic field to the magnetic amorphous structure and is disposed in a longitudinal direction with respect to the magnetic amorphous structure, wherein the core section is disposed on each side of the magnetic amorphous structure in the longitudinal direction;
environmental magnetic field cancellation means generates a correction magnetic field that cancels an environmental magnetic field due to terrestrial magnetism input to the magnetic amorphous structure;
observation means that serially observes the magnetic field including a magnetic field signal based on an output from an induced current generating transmitter;
storage means that stores observational data observed by the observation means; and
correction means that corrects a reference value of the observational data so that the observational data falls within a desired range based on a value obtained by integrating the observational data stored in the storage means for a period in which an integral value of the magnetic field signal based on the output from the induced current generating transmitter is zero.

16. A magnetic field sensor device comprising:
a sensor section that includes a magneto-impedance device having a magnetic amorphous structure;
a rod-shaped core section that guides a magnetic field to the magnetic amorphous structure and is disposed in a longitudinal direction with respect to the magnetic amorphous structure, wherein the core section is disposed on each side of the magnetic amorphous structure in the longitudinal direction, and wherein the core section is disposed so that the longitudinal direction of the magnetic amorphous structure coincides with a longitudinal direction of the core section;
environmental magnetic field cancellation means that generates a correction magnetic field that cancels an environmental magnetic field due to terrestrial magnetism input to the magnetic amorphous structure;
observation means that serially observes the magnetic field including a magnetic field signal based on an output from an induced current generating transmitter;
storage means that stores observational data observed by the observation means; and
correction means that corrects a reference value of the observational data so that the observational data falls within a desired range based on a value obtained by integrating the observational data stored in the storage means for a period in which an integral value of the magnetic field signal based on the output from the induced current generating transmitter is zero.

* * * * *